United States Patent [19]

Groudan et al.

[11] Patent Number: 4,464,747
[45] Date of Patent: Aug. 7, 1984

[54] HIGH RELIABILITY MEMORY

[75] Inventors: Alan I. Groudan, Harrington Park; Garry E. Pitt, Towaco; Lell E. Barnes, North Caldwell, all of N.J.

[73] Assignee: The Singer Company, Little Falls, N.J.

[21] Appl. No.: 349,873

[22] Filed: Feb. 18, 1982

[51] Int. Cl.³ .......................................... G06F 11/10
[52] U.S. Cl. ...................................... 371/50; 371/21; 371/51
[58] Field of Search .................... 371/50, 51, 49, 21, 371/10

[56] References Cited

U.S. PATENT DOCUMENTS

| | | | |
|---|---|---|---|
| 3,037,697 | 6/1962 | Kahn | 371/50 |
| 3,054,560 | 9/1962 | Hartley | 371/9 |
| 3,200,374 | 8/1965 | Ballard | 371/50 |
| 3,222,653 | 12/1965 | Rice | 371/10 X |
| 3,737,870 | 6/1973 | Carter et al. | 364/200 |
| 3,803,560 | 4/1974 | DeVoy et al. | 371/10 |
| 3,876,978 | 4/1975 | Bossen et al. | 371/51 |
| 3,898,443 | 8/1975 | Smith | 371/10 |
| 3,937,936 | 2/1976 | Saporito et al. | 371/8 |
| 4,031,374 | 6/1977 | Groudan et al. | 371/10 X |
| 4,053,751 | 10/1977 | Ault | 371/50 |
| 4,093,985 | 6/1978 | Das | 364/200 |
| 4,133,027 | 1/1979 | Hogan | 371/9 X |
| 4,141,066 | 2/1979 | Keiles | 371/9 X |
| 4,195,770 | 4/1980 | Benton et al. | 371/51 |
| 4,304,002 | 12/1981 | Hunt | 371/49 |
| 4,365,332 | 12/1982 | Rice | 371/50 |
| 4,368,532 | 1/1983 | Imazeki et al. | 371/51 |
| 4,371,963 | 2/1983 | Edwards, Jr. et al. | 371/50 |

OTHER PUBLICATIONS

Edwards, Lee, "Low Cost Alternative to Hamming Codes Corrects Memory Errors," Computer Design, pp. 143-148, (Jul. 1981).

Walker, W. K. S. et al., "A Reliable Spaceborne Memory with a Single Error and Erasure Correction Scheme," *IEEE Transactions on Computers*, vol. C-28, No. 7, pp. 493-500, (1979).

Primary Examiner—Charles E. Atkinson
Attorney, Agent, or Firm—Joel Miller; Thomas W. Kennedy

[57] ABSTRACT

The disclosure describes a memory system having a large bit capacity, capable of detecting, locating, and correcting errors. The memory is subdivided into several identical storage matrices wherein parity calculations are performed in the vertical direction within a matrix and in the horizontal direction across a series of matrices. The system also has provision for self-repairs.

4 Claims, 16 Drawing Figures

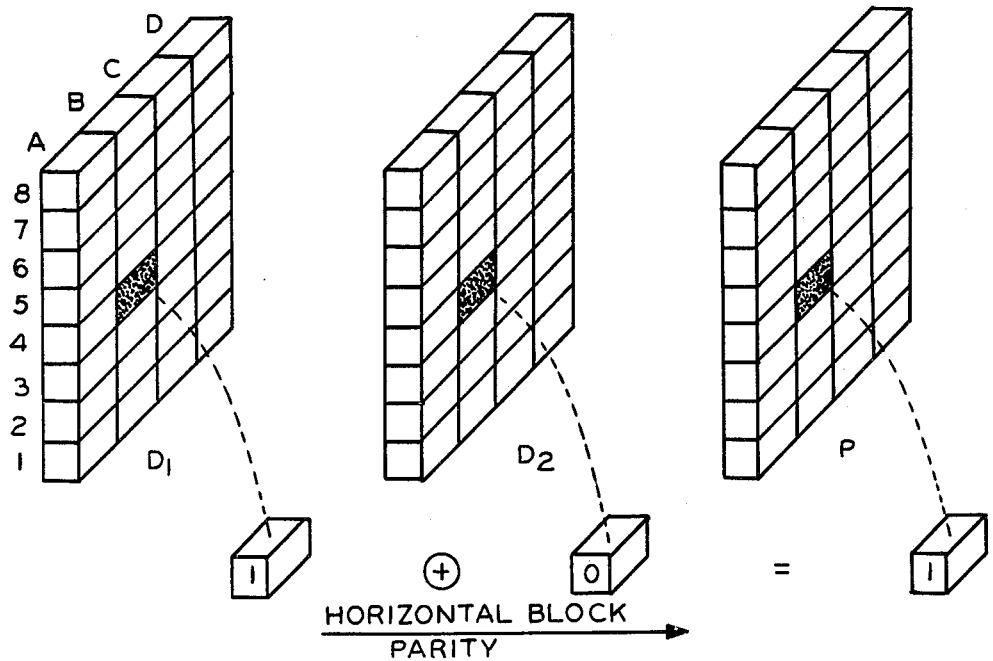

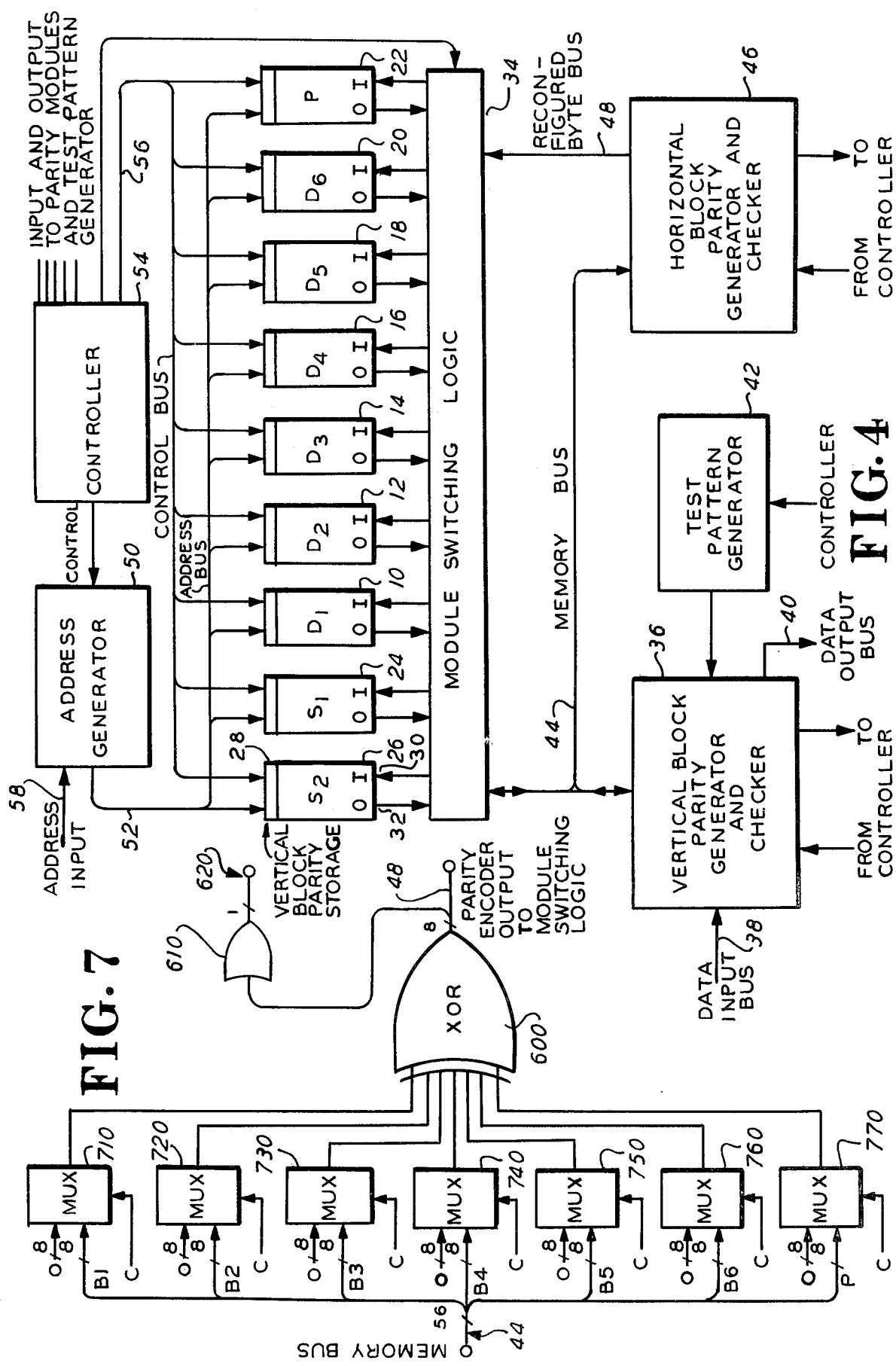

VERTICAL BLOCK PARITY GENERATION SEQUENCE

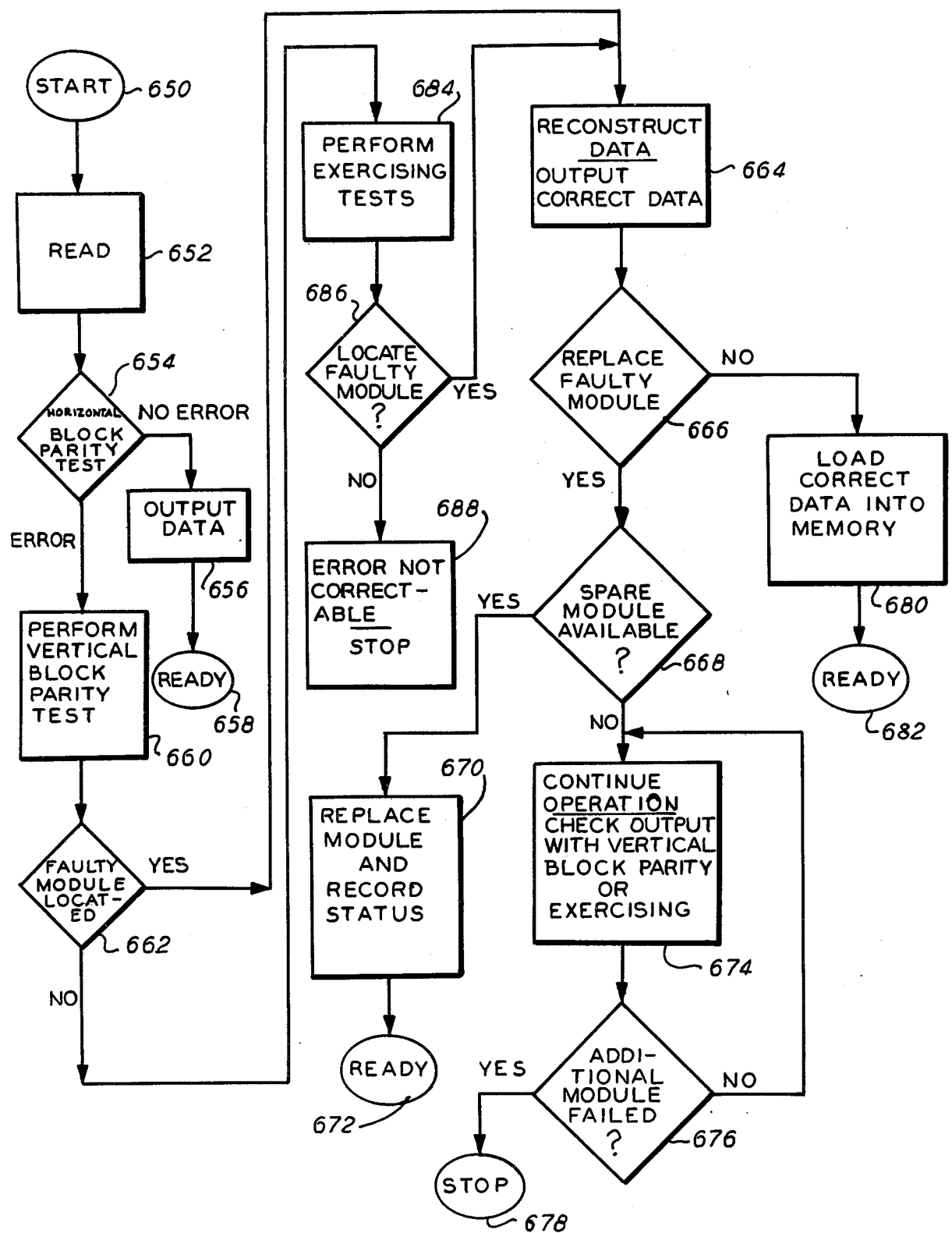
FIG. 11 DATA RETRIEVAL AND ERROR CORRECTION SEQUENCE

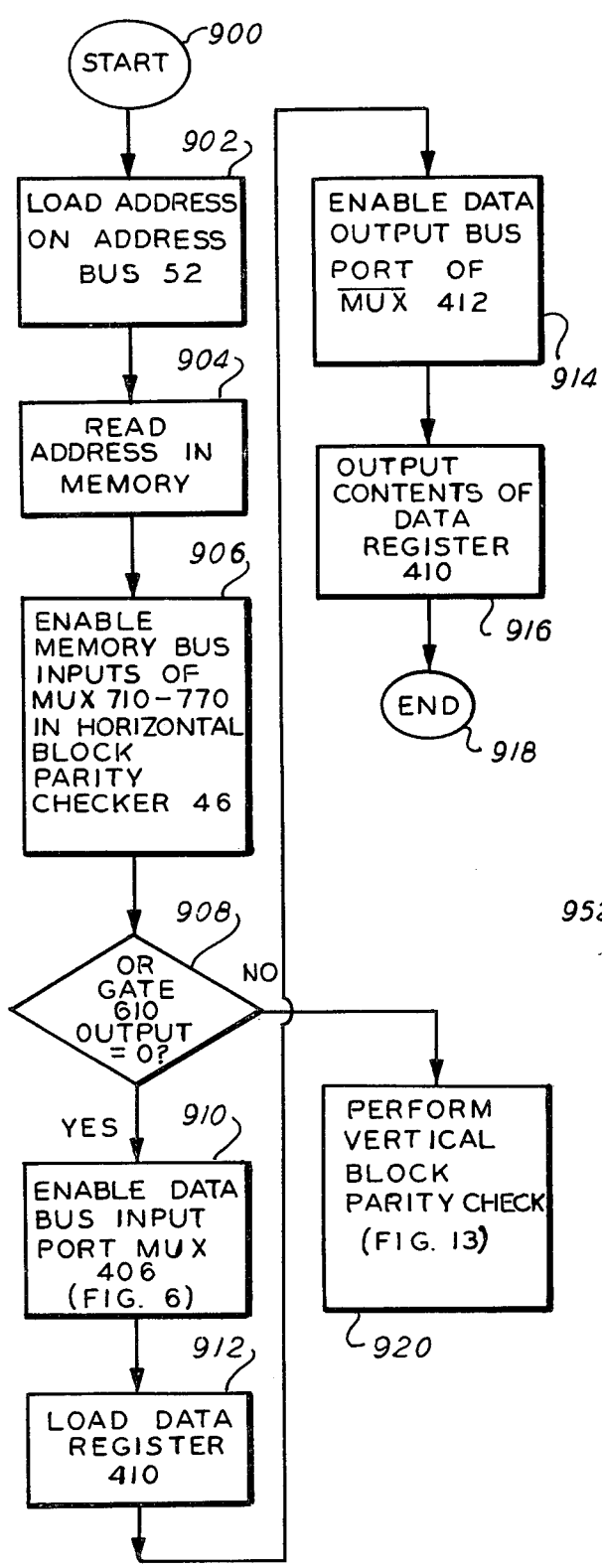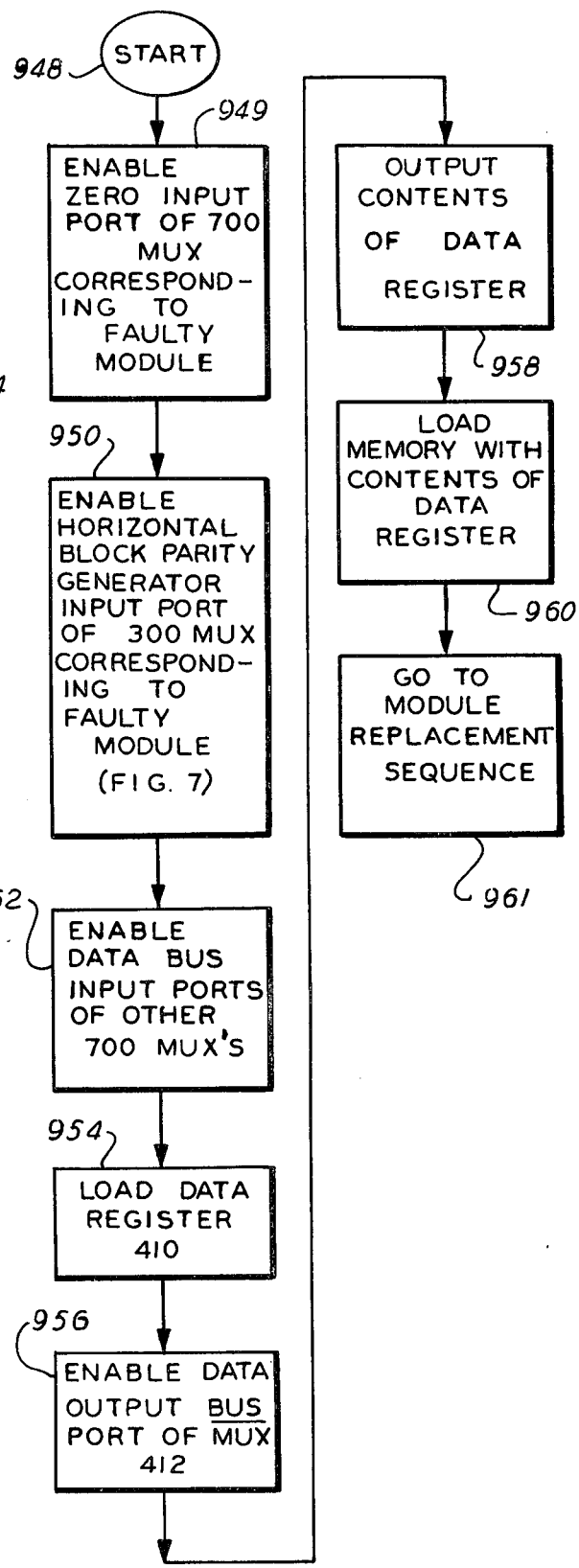

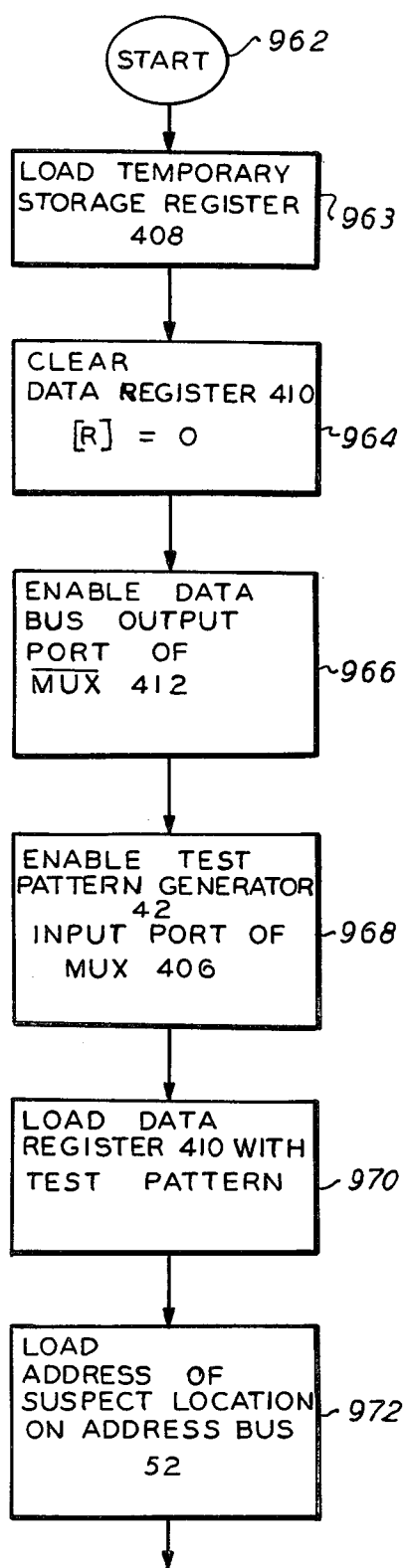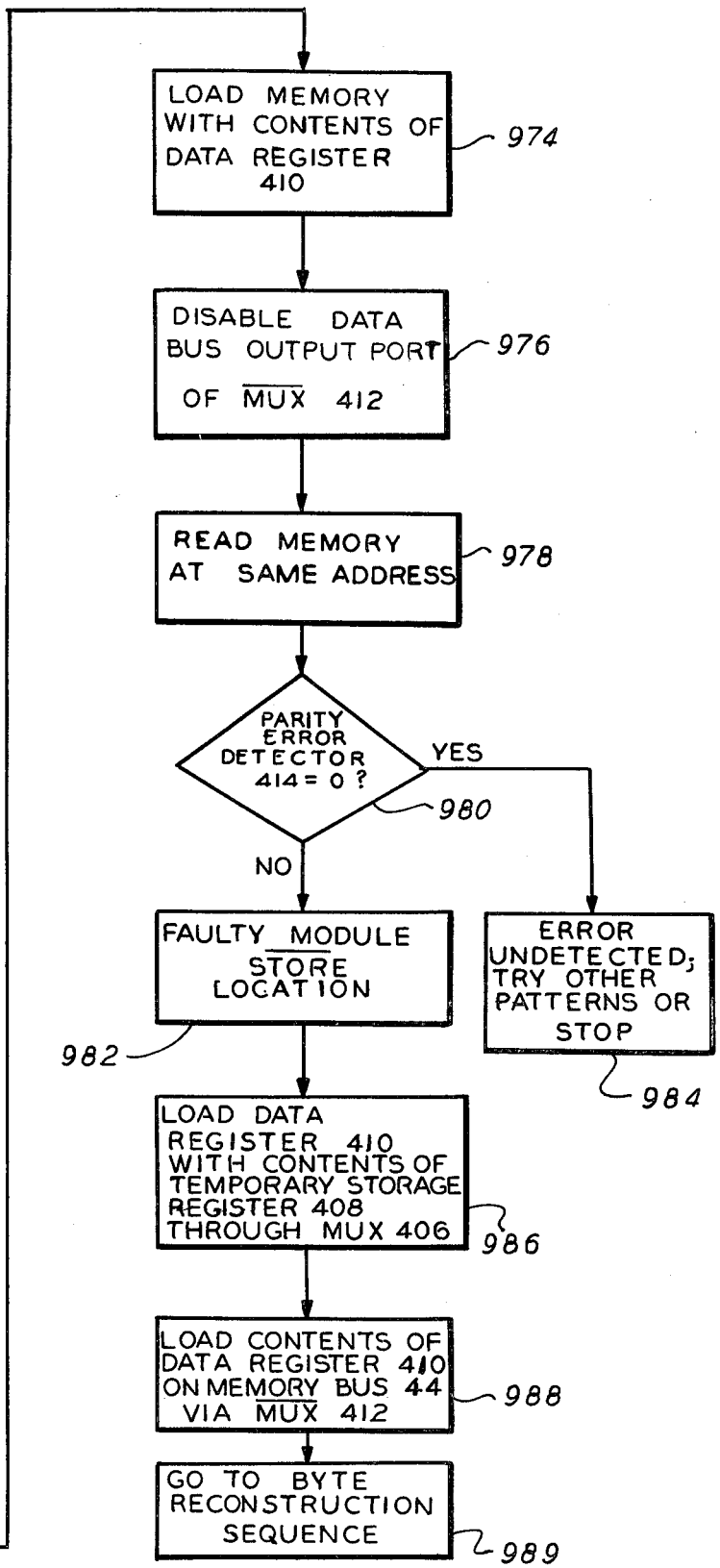
FIG. 15 EXERCISING SEQUENCE

MODULE REPLACEMENT SEQUENCE

HIGH RELIABILITY MEMORY

CROSS REFERENCE TO RELATED APPLICATION

This application is related to a copending application for a "Multiple Event Hardened Core Memory," invented by George F. Schroeder, Garry Pitt, Jack Scully, and Lell Barnes, filed Nov. 6, 1981. U.S. Pat. No.

This invention is related to computer memories having error detection, location, correction, and self-repair capability.

The memory is a vital component in any computer system. In addition to storing information during periods of non-activity, it also serves as a work area for the computer system during computing operations. The accuracy and reliability of any computer is predicated in part upon having a dependable memory system. Should the memory experience an error or a failure, the performance of the computer will be degraded in proportion to the severity of the failure. It is thus desirable to design a memory with sufficient safeguards against anticipated failure conditions.

Several approaches have been developed to improve the integrity and reliability of memories. From a hardware standpoint, fully redundant circuitry may be provided as a backup for components that may fail. The drawback of this approach is high cost and space requirements. To improve integrity, various error correcting schemes, such as an error correcting code, may be utilized. This usually requires significant memory space to accommodate the error correcting code, which is appended to the data. In accordance with the particular code used, the data and the code bits can be checked to determine whether or not the retrieved data is correct. The ability of any error correcting code to provide detection and correction information is limited by the number of bits in the code and normally, for a given length of code, only a fixed number of errors may be detected and corrected within a string of X bits. To expand the detection and correction capability, the size of the error code must be increased and can reach the point where it requires storage space effectively equal to multiple redundancy. Then, it may be easier to resort to totally redundant memories.

The goals in providing a better memory are twofold. First, it is desired to have an error detection and correction system that requires a minimal amount of hardware for implementation. Second, improved system reliability is an important objective. Improved reliability may be realized through system techniques, as well as more reliable components and manufacturing techniques.

SUMMARY OF THE INVENTION

Statistical studies have shown that a majority of the errors in a computer memory will be limited to a single hardware module; simultaneous multiple module errors occur with negligible frequency. By making the assumption that only one error will occur at any given time, one can design a practical and realizable scheme for detection and correction of errors that will fail in only a vanishingly small number of cases. Further, assuming no more than one module in error at any given time, a more reliable hardware configuration can be developed. The foregoing can be achieved by distributing the memory across a series of modules. Each such module would be a self-contained memory in its own right, having identical bit dimensions of width and length, respectively. In the context of a series of modules, the assumption set forth above dictates that only one module will experience an error at any one time. In other words, errors in two separate operating modules will never occur simultaneously. By restricting "permissible" errors to a single module, it becomes possible to achieve a detection capability of 100%.

In accordance with the invention, there is provided a memory capable of detecting, locating, and correcting errors. The memory is subdivided into modules of equal capacity and provision is made for storage of parity check words. Parity calculations are performed in a block, i.e., entire words from a module are exclusive-ORed with each other resulting in a parity check word of corresponding length as opposed to merely a check bit. Furthermore, given that the modules have a "rectangular" configuration, the parity checks are performed in both the vertical and horizontal directions. Horizontal block parity is defined as the exclusive-OR summation of similarly oriented bits in each module.

Additionally, the invention contemplates spare memory modules that will replace active modules when the latter become defective.

For a better understanding of the present invention together with other and further objects, reference is made to the following description taken in conjunction with the accompanying drawings.

BRIEF DESCRIPTION OF THE DRAWINGS

FIG. 1 is an illustration of block parity.

FIG. 2 is an illustration of double level vertical block parity.

FIG. 3 is an illustration of horizontal block parity across three modules.

FIG. 4 is a schematic block diagram of a self-repairing high reliability memory.

FIG. 7 is a schematic diagram of the horizontal block parity generator and checker.

FIG. 11 is a flow chart of the data retrieval and error correction sequence.

FIG. 12 is a flow chart of the read sequence.

FIG. 14 is a flow chart of the byte reconstruction sequence.

FIG. 15 is a flow chart of the exercising sequence.

DESCRIPTION OF THE PREFERRED EMBODIMENT

Figure 5:
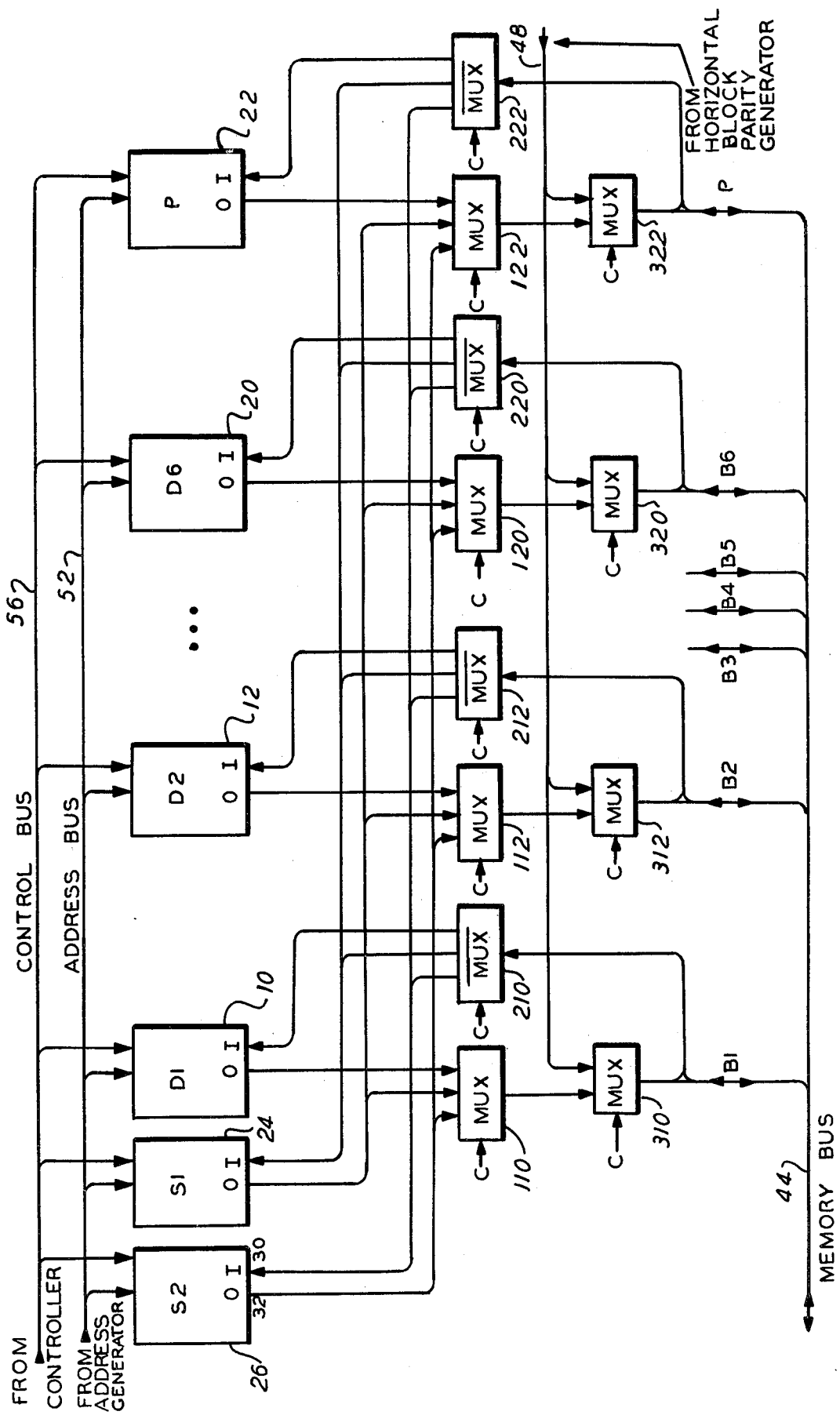
FIG. 5 is a schematic diagram of the memory modules and the module switching logic.

One of the most common schemes for detecting errors in a string of bits is parity. Parity is based on the mathematical operation called modulo-two addition. It is also known as the exclusive-OR function. For example, if one were to take the string of bits 1011 and perform the exclusive-OR function, a parity bit or parity check bit of 1 would be the result.

$$1 \oplus \oplus \oplus 1 \oplus 1 = 1 \tag{1}$$

This is an example of even parity. If the result of the exclusive-OR operation was inverted, then it would be called odd parity. One may choose to use either even or odd parity, depending upon the particular circumstances. Throughout this discussion, it will be assumed for the purpose of illustration that all parity operations will yield even parity.

The concept of parity of a string of bits may be expanded for use in a more complicated structure. Consider a two dimensional block of bits consisting of columns and rows of bits, as illustrated in FIG. 1. Next to each row are the designations $A_0$, $A_1$, $A_2$, $A_3$, and P. Adjacent the top of each column are the numerals 1 through 4. Each row in the block represent a data word having an arbitrary length of four bits. $A_0$ through $A_3$ are data words and word P is a parity check word. By performing the exclusive-OR function in the vertical direction, it can be seen that the exclusive-OR of the bits in columns 1 through 4 of the data bits yields the parity bit in each corresponding column. This can be shown and performed in one of two ways. For each column, the bits may be individually exclusive-ORed together to yield the parity bit for that column. To complete the parity check word for the block, it is necessary to do this four times. However, it is also possible to achieve the same result by exclusive-ORing the words themselves yielding the parity word in one operation.

$$A_0 \oplus A_1 \oplus A_2 \oplus A_3 = P \tag{2}$$

In a hardware realization, parallel circuitry having four channels can perform this function.

Double Level Vertical Block Parity

In a memory having considerably more bits than the block illustrated in FIG. 1, one may resort to more sophisticated methods for generating parity. Consider the arrangement shown in FIG. 2. This memory segment has sixteen words of data and eight words for parity. Words 0 through 3 can be considered to be equivalent to words $A_0$ through $A_3$ in the block in FIG. 1. The corresponding check word for words 0 through 3 is word 16 (parity word A) in the middle block of FIG. 2. Proceeding upward in the data storage area, from word 4 through word 15, the pattern repeats itself. Similarly, parity check words B, C, and D are provided in words 17, 18, and 19, respectively. Together, parity check words A, B, C, and D represent the first level of vertical block parity. However, this arrangement is arbitrary and parity check words may be generate utilizing different segments from the data block of words 0 through 15. Such an alternative arrangement is illustrated in vertical block parity level two of FIG. 2, where parity check words 1 through 4 are shown. At the left-hand side of each data word, the numbers 1 through 4 are shown repeating for words 0 through 15. By performing the exclusive-OR of each word having the number 1, a unique parity check word is generated (c.f., the parity check words in level 1). Similarly the same can be done for data words having the numbers 2, 3 and 4.

Based upon the foregoing, one can envision increasing levels of sophistication as other parity check words are added. With each added level, greater capability of error detection and correction is achieved. However, a compromise must be made between the desired capability of detection and dedication of memory solely for error correction purposes.

Horizontal Block Parity

The above examples illustrate parity within a single module of memory. In large mass memories, it is not uncommon to have the memory distributed over several different, although identical, pieces of hardware. For example, a memory may consist of several random access memories (RAM). If the modules are identical, then the rows and columns of each module are likewise similar. The concept of parity may be applied across the series of modules in the same way as within a module. This is illustrated in FIG. 3. Three arbitrary modules D1, D2, and P, each having four-bit rows and eight-bit columns, are shown. A randomly selected bit, at the intersection of column B and row 4 in this case, is selected from each of data modules D1 and D2. The contents of these locations are exclusive-ORed together yielding a third bit which is placed in the same location in module P, the parity module. This is repeated for every bit location within modules D1 and D2 and the result is defined as horizontal block parity. In this example, the horizontal block parity is for two modules four bits wide.

Memory Architecture

The architecture of the self-repairing high reliability memory is illustrated in FIG. 4. The central components of the memory are the data storage modules 10, 12, 14, 16, 18, and 20, designated as D1, D2, D3, D4, D5, and D6, respectively. The choice of six data modules is purely arbitrary; a different number may be selected based upon design considerations. Another module 22 is designated as the parity storage module P. Together, the data modules and the parity module comprise the seven active module locations of the memory. At any given time, seven modules will be operative within the memory. To the left of the data modules, two further modules 24 and 26 are provided as spare modules and designated S1 and S2, respectively. At the top of each module, a block 28 is provided for storage of vertical block parity check words. This is shown for convenience and it is not mandatory that the vertical block parity check words be stored here. Such information could be stored anywhere in the modules.

The memory modules illustrated here have connections 30 and 32, for input and output of data, respectively. These ports are connected to the module switching logic 34, which substitutes the spare modules S1 and S2 for defective operating modules and provides data interconnection with other parts of the memory system.

In the lower left hand corner, there is a block 36 designated as the vertical block parity generator and checker. This subcircuit generates vertical block parity words and performs checks of vertical block parity during the read operation. For convenience, the input and output ports of the memory system are contained within this module; the data input bus 38 and the data output bus 40 are shown going to and from block 36. A test pattern generator 42 is also shown connected to the vertical block parity generator and checker. Data is passed to and from block 36 via the memory bus 44. This subcircuit will be explained subsequently in greater detail.

The horizontal block parity generator and checker 46 is shown as a block in the lower right corner of FIG. 4. This subcircuit is also connected to the memory bus 44 and has a further connection to the module switching logic 34 via a reconfigured byte bus 48. The horizontal block parity generator and checker 46 creates the parity check bytes which are stored in the parity module P (22) and performs checks of horizontal block parity when data is read from the active data modules D1 through D6. In case of an error, this subcircuit is also capable of reconstructing a byte of data using the principles of parity. The details of this circuit will also be addressed subsequently.

To complete this memory system, two other items are necessary. One is an address generator 50 that provides addresses for each of the memory modules via address bus 52. The other is a controller 54 that communicates with the memory modules via the control bus 56. Other lines from the controller 54 are also provided for communication with the address generator 50, the module switching logic 34, the parity generator/checkers 36 and 46, and the test pattern generator 42.

Module Switching Logic

The module switching logic is illustrated together with the memory modules in FIG. 5. For clarity, only three of the data modules D1, D2, and D6 are shown; the circuitry required for data modules D3, D4, and D5 is identical to that shown for the other data modules. In this embodiment, the module switching logic consists entirely of the multiplexers ("MUX") and demultiplexers ("MUX"), which may be thought of as multiple position switches. To accommodate the spare modules, S1 and S2, a series 100 of threeport multiplexers and a series 200 of three-port demultiplexers are provided for channeling the output and input, respectively, of each operative location. Consider the active location for data module D1. Multiplexer 110 and demultiplexer 210 are dedicated to this location for switching in spare modules S1 and S2. The outputs of data modules D1, S1, and S2 are connected to multiplexer 110. In a similar fashion, the inputs to these modules are connected to demultiplexer 210. Each multiplexer and demultiplexer has control lines ("C") running back to controller 54. For the purposes of this discussion, it may be assumed that control lines C for each multiplexer are unique, permitting the controller to enable each device separately.

During initial start up, when all modules are presumably functional, the multiplexers and demultiplexers connect the memory bus 44 to modules D1 through D6 and P. This configuration may be achieved by enabling the proper ports on the multiplexers and demultiplexers; the spare modules S1 and S2 are inactive and are not connected. Should one of the modules fail, the proper control signals from the controller 54 will enable the multiplexer and demultiplexer at the defective location to direct input and output to and from an available spare module. It is contemplated that the switching or control for the multiplexers and demultiplexers may be non-volatile. If the power fails, non-volatile switching will permit proper reconnection of the active modules when power is restored.

A series 300 of two-port multiplexers is also provided for channeling the output of the horizontal block parity generator onto the memory bus 44 in the proper byte location. This configuration requires seven multiplexers, one for each active location. One input of each multiplexer is connected to the reconfigured byte bus 48 from the horizontal block parity generator 46. The other input is provided from the series 100 of multiplexers, which channel the output from each operative location. By selectively enabling one of the multiplexers, the output from the horizontal block parity generator may be loaded on the memory bus 44 instead of the output from memory module of that particular location. Finally, the inputs to the 200 series of demultiplexers are connected to the appropriate lines of the memory bus 44.

Vertical Block Parity Generator and Checker

Figure 6:
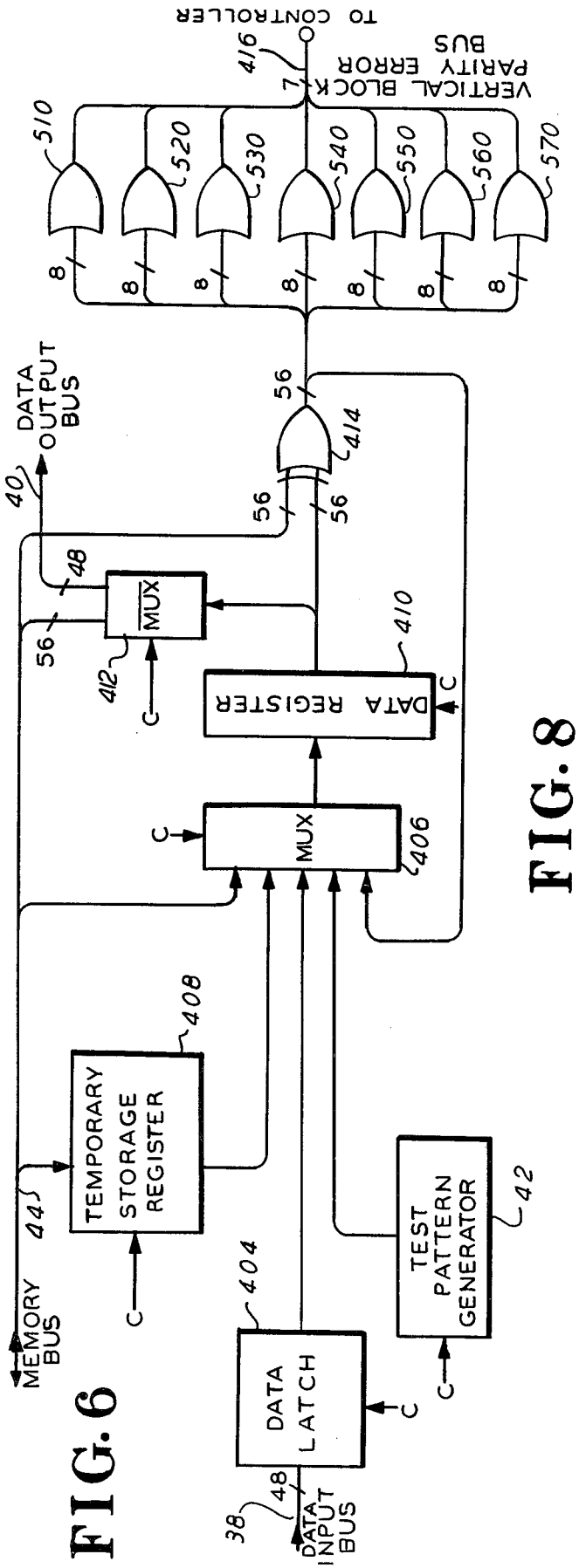
FIG. 6 is a schematic diagram of the vertical block parity generator and checker and associated circuitry.

The details of the vertical block parity generator and checker (block 36 in FIG. 4) are shown in FIG. 6. Data is entered into the memory system on the data input bus 38. The slash line and the numeral 48 indicate that this bus consists of forty-eight lines, corresponding to six data modules having a width of eight bits each. The data enters the data latch 404, which serves as a temporary storage register and is connected to one input of a five-port multiplexer 406. This multiplexer serves a variety of switching functions during data input, data output, and error detection and correction. Additionally, the multiplexer 406 has inputs from the memory bus 44, a temporary storage buffer 408, and a test pattern generator 42. As in FIG. 5, the lines designated with the letter C are control lines from the controller. The output of multiplexer 406 is connected to the data register 410, which in turn is connected to a demultiplexer 412 and an exclusive-OR gate 414. The demultiplexer 412 has two outputs: an output to the data output bus 40 and an output to the memory bus 44.

Exclusive-OR gate 414 performs the parity generating function for vertical block parity. As noted previously, it receives input from the data register 410; a second input is provided from the memory bus 44. The output of exclusive-OR gate 414 has fifty-six lines. These are separated into seven bundles having eight lines apiece, each bundle corresponding to one active memory module location D1, D2, D3, D4, D5, D6, and P, respectively. Each bundle is connected to one of seven OR gates 510, 520, 530, 540, 550, 560, and 570, which performs an OR function on all eight lines, producing a single line output. Errors in vertical parity are located by this bank 500 of OR gates. Their outputs are sent back to the controller as a seven line signal on the vertical block parity error bus 416. The fifty-six line output of exclusive-OR gate 414 is also connected to the fifth and final input of multiplexer 406.

Horizontal Block Parity Generator and Checker

Horizontal block parity generation and checking is performed by an exclusive-OR gate 600, illustrated in FIG. 7. The inputs to exclusive-OR gate 600 are provided in seven, eight-bit channels from a series 700 of two-port, eight-bit multiplexers. Each multiplexer corresponds to one operative memory module location and has an input from the memory bus for that location. The other inputs are at logical zero for generating logical zero for any desired eight bits out of fifty-six. Also, each multiplexer has a control input permitting the controller to individually enable selected ports of the multiplexers.

The output of exclusive-OR gate 600 is the reconfigured byte bus 48, which consists of eight lines connected to the 300 series multiplexers in the module switching logic 34. An OR gate 610 for detecting horizontal block parity error is connected to the same line and performs an OR summation of all eight lines. The single line output 620 is connected to the controller 54.

Operation of the Memory—Memory Organization

Figure 8:
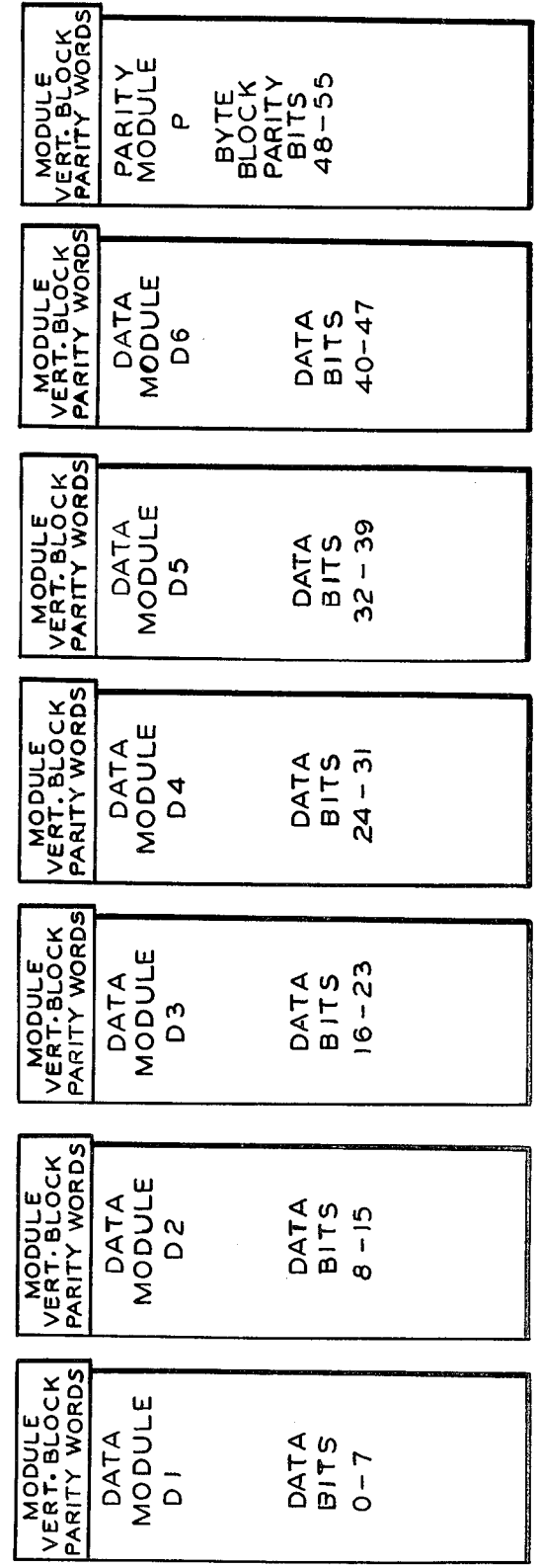
FIG. 8 is a block diagram of the organization of the memory.

In order to discuss the operation of the memory system, a hypothetical memory organization must be designed for use as a working example. The organization illustrated in FIG. 8 is one such example and is consistent with the dimensions used previously. This figure shows only the data modules and a parity module; no spare modules are shown since they do not represent active, or operative, memory module locations. Each module has an arbitrary width of eight bits, and this is defined as a byte. The combination of one byte from each data module D1 through D6 across the entire width of the memory, bit 0 through 47, comprises a data word. When the parity bits 48 through 55 are added to the data word, this string of bits, bits 0 through 55, is defined as a memory word. At the top of each module, storage space is shown for vertical block parity bytes. These are generated by taking the exclusive-OR summation of each vertical column of bits. The information stored in the parity module P is comprised of the horizontal block parity check bytes generated from the data stored in modules D1 through D6. This is achieved in exactly the same manner as shown in FIG. 3. For example, bit 48 is the exclusive-OR summation of bits 0, 8, 16, 24, 32, and 40. The relationship may be set forth in the following equation.

$$D1 \oplus D2 \oplus D3 \oplus D4 \oplus D5 \oplus D6 = P \quad (3)$$

where D1 through D6 represent the bits in data modules D1 through D6 and P represents the bits stored in parity module P.

As noted previously, wherever parity is referred to, even parity is intended. Also, vertical block parity will be restricted to a single level. For increased detection and correction capability, one may employ added levels of even vertical block parity, or odd vertical block parity.

It will be assumed in the following operations that errors may occur in only one of the modules shown in FIG. 8 at any given time. That is, during a read or write operation, only one of the modules may suffer a storage or a transmission error. Under this assumption, there will be 100% detection capability. Depending upon the severity and the nature of the error, the ability to correct this error can approach 100%.

It should be noted that the generation of the block addresses and the block parity addresses can be made by a well known, simple, and orderly process and therefore is not described herein. The address generator 50 has an input 58 for accepting addresses.

Figure 9:
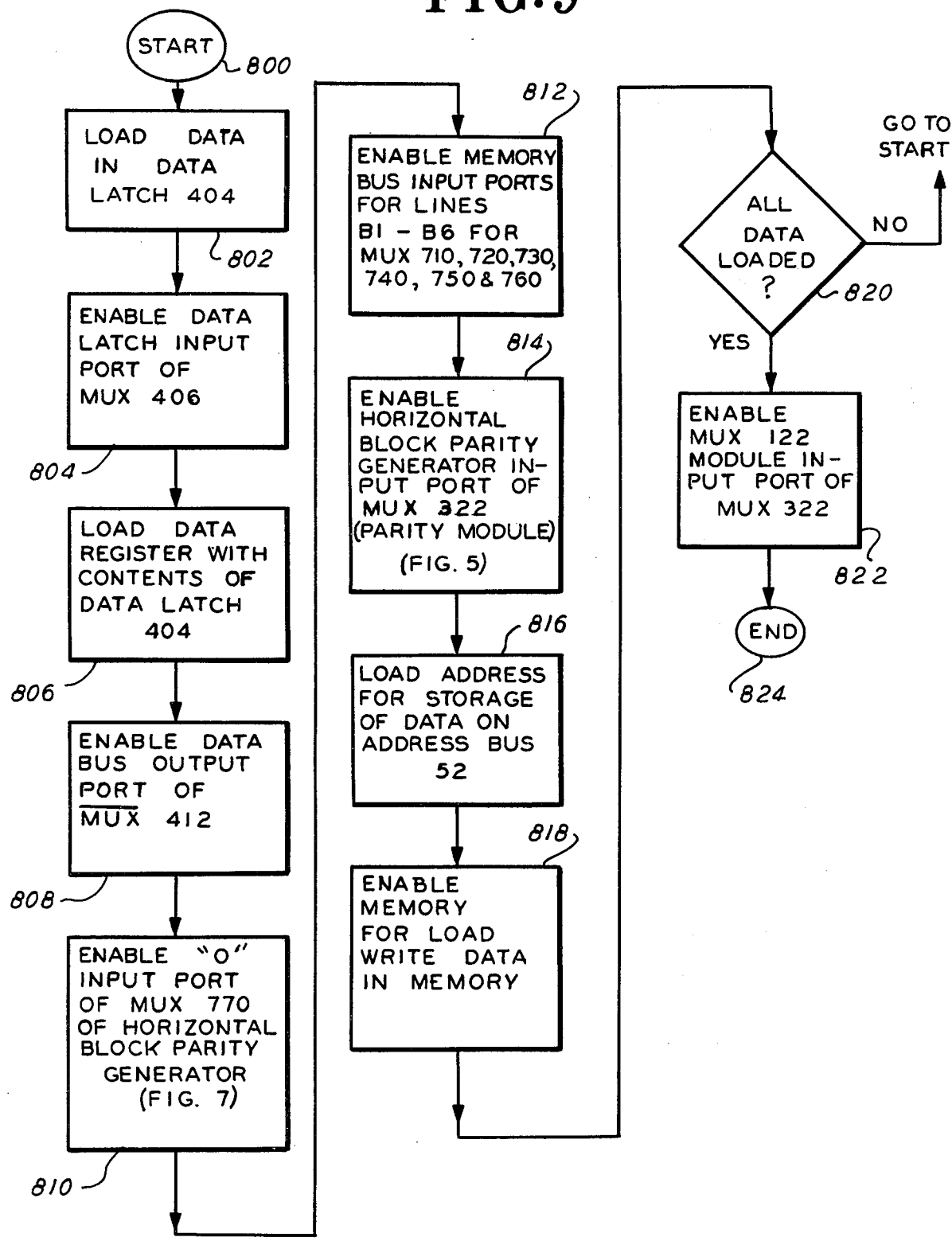
FIG. 9 is a flow chart of the memory write sequence.

Data Load or Memory Write—FIG. 9

A flow chart explaining the memory write sequence is shown in FIG. 9. It will be helpful to consult FIGS. 4, 5, 6 and 7 when reading this flow chart. The numbers in parentheses refer to the blocks in the flow chart.

The data enters the system on the data input bus 38 and is stored in the data latch 404 (802). Next, the input port of multiplexer 406 for the data latch 404 is enabled by the controller 54 (804). The data register 410, which is connected to the output of multiplexer 406, can now be loaded with the contents of the data latch 404 (806). In order to channel the data to the module inputs, the memory bus 44 output of demultiplexer 412 is enabled by the controller 54 (808).

There are several approaches to generating parity check bits for both vertical block parity and horizontal block parity. It is possible to concurrently generate this information during the write operation. However, in the embodiment illustrated in FIGS. 4 through 7, only horizontal block parity is generated during this sequence. The bits for vertical block parity will be generated in another sequence, but could have easily been generated concurrently with the addition of minimal hardware.

The next step in the memory write sequence permits generation of the horizontal block parity bits. The zero input port of multiplexer 770 (FIG. 7) of the horizontal block parity generator is enabled (810). As described previously, the memory bus 44 output can be fed directly to the exclusive-OR gate 600. If any one input is set to zero, the circuit will generate the missing byte. In this case, it is desired to generate bits 48 through 55; therefore bits 0 through 47 are supplied to the exclusive-OR gate 600. By taking horizontal block parity summation of the bits in the data word, the parity bits 48 through 55 can be generated. This is consistent with the definition of parity as set forth in Equation 3. On a "byte" basis, the equation would appear as follows:

$$b_1 \oplus b_2 \oplus b_3 \oplus b_4 \oplus b_5 \oplus b_6 = b_p \quad (4)$$

where $b_1$ through $b_6$ represent the bytes of one data word and $b_p$ is the corresponding parity check byte.

The remaining multiplexers 710, 720, 730, 740, 750, and 760 are enabled to accept the information on the memory bus 44 (812).

The output of exclusive-OR gate 600 is channeled to the module switching logic 34 on the reconfigured byte bus 48 to the input port of multiplexer 322, which is enabled by the controller 54 (814). When the memory modules are loaded, the data information will come through the memory bus 44, but the data for the parity module 22 is supplied by the horizontal block parity generator 46 through multiplexer 322. The address for the data that has been entered is now loaded on the address bus 52 (816). The controller 54 enables the memory for a load operation and the data is entered into the memory modules via the 200 series multiplexers (818).

After the data word has been entered, the controller interrogates itself to determine whether all data has been loaded (820). If there is more data to be entered the controller returns to the start of the routine and the process is repeated. If all data has been entered satisfactorily, the input of multiplexer 322 for the output of multiplexer 122 is enabled (822).

Figure 10:
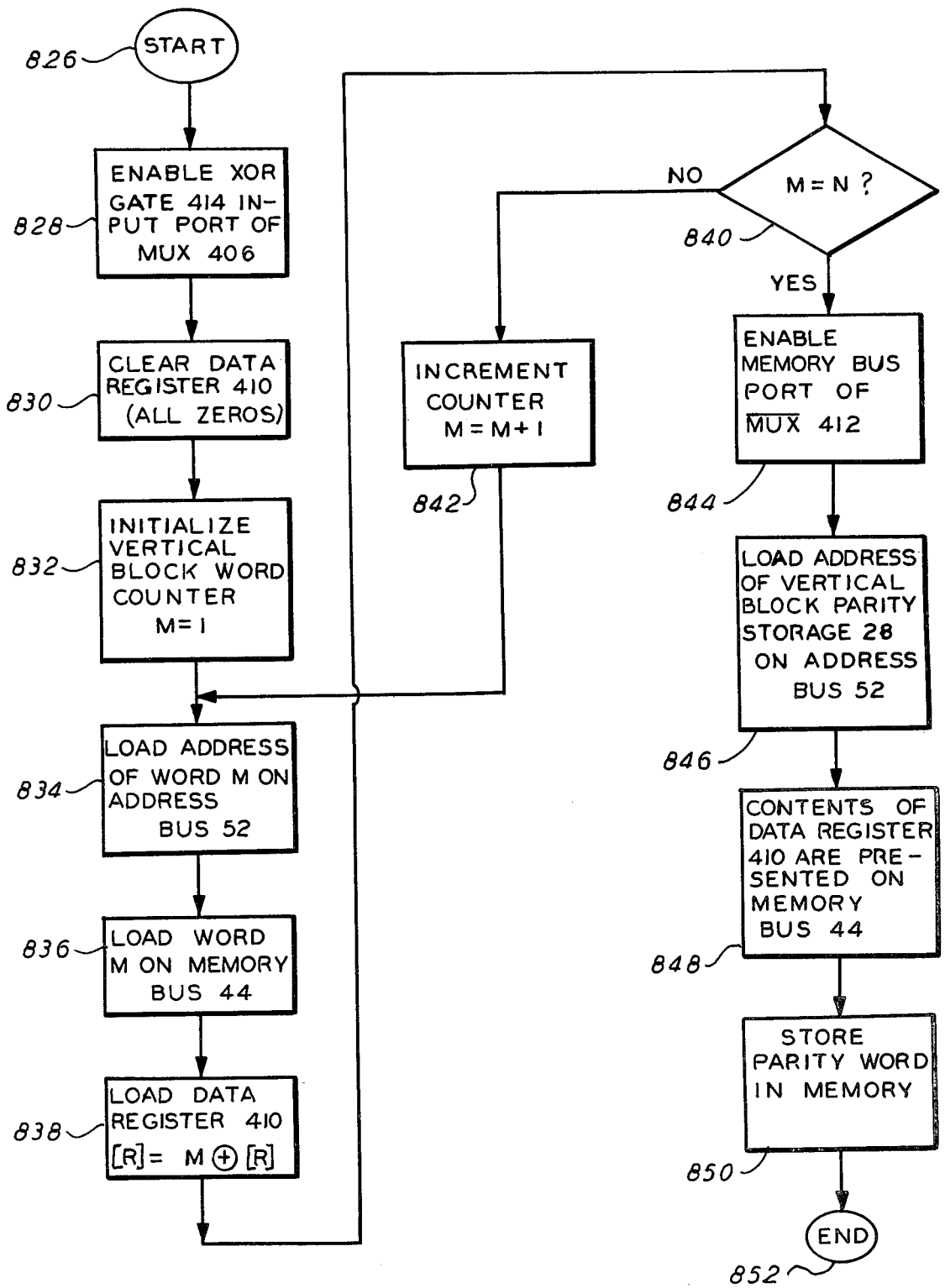
FIG. 10 is a flow chart of the sequence for generation of vertical block parity words.

Generation of Vertical Block Parity—FIG. 10

The very nature of the exclusive-OR function dictates that the vertical block parity bytes be generated from the data bytes in a sequential, but cumulative, fashion. Mathematically, the operation would appear as follows:

$$b_0 \oplus b_1 \oplus b_2 \oplus b_3 \ldots \oplus b_n = b_p \quad (5)$$

where $b_0-b_n$ are the data bits in the vertical direction and $b_p$ is the parity bit.

In actuality, the solution would appear slightly different.

$$(\ldots(((b_0 \oplus b_1) \oplus b_2) \oplus b_3) \ldots) \oplus b_n = b_p \qquad (6)$$

Here it can be seen that this operation is a series of partial exclusive-OR summations of no more than two operands at any one time. Equation 6 is an equivalent expression of Equation 5.

Exclusive-OR gate 414 (FIG. 6) performs the cumulative exclusive-OR summation and the result is stored in the data register 410. The vertical block parity generation sequence, illustrated in FIG. 10, begins with the enabling of the exclusive-OR gate 414 input port of multiplexer 406 (828). The data register 410 is then set to zero (830).

It will be assumed that the data in each active module is organized in vertical blocks having an arbitrary number N bytes. A counter in the controller 54, designated as the variable M, is set to one (832). The address of the first word in the block, corresponding to M, is loaded on the address bus 52 (834). On command from the controller 54, the word corresponding to M is loaded on the memory bus 44 (836). At this time, the exclusive-OR gate 414 sees the information on the memory bus 44 and the contents of the data register 410 which is initially all zeros. The output of the exclusive-OR gate 414 is thus the exclusive-OR summation of the former and the latter. This output is channeled through multiplexer 406 and stored in the data register 410 (838). The contents of the data register 410 is only the partial exclusive-OR summation for the block of data.

The controller then checks the counter to see if the end of the block has been reached by comparing M with N (840). If M is less than N, then the counter is incremented and a new address is loaded on the address bus 52 (842). Another word, corresponding to the new M, is loaded on the memory bus 44 (836), a new partial summation is generated, and the result is stored in the data register 410 (838). Again, the status of the counter is compared against the number N (840) and it is incremented if necessary (842). When all the data has been read and processed, the data register 410 contains the vertical block parity word for that block. The memory bus output port of demultiplexer 412 is enabled (844) and the address of the vertical block parity storage is loaded on the address bus 52 (846). The contents of the data register are then presented on the memory bus 44 (848) and stored in the memory modules (850). This completes the memory write sequence and a sequence for vertical block parity generation (852).

Data Retrieval and Error Correction—FIG. 11

The operations that follow are concerned with reading the memory, detecting and correcting errors, and replacing faulty modules. Before examining each of them in detail, it would be helpful to consider them generally. Their interrelationship is illustrated in the flow chart in FIG. 11. The sequence properly begins at START (650).

On command from the computer, a "read" operation is initiated (652). When the data has been fetched, the memory system performs a horizontal block parity test to determine whether the retrieved data is correct (654). If there is no error, the system outputs the data (656) and waits for a new command at READY (658).

If an error is detected, the system will attempt to locate the error and then correct it. The first method used for error location is a vertical block parity test (660). The memory controller then interrogates the system to determine whether or not the faulty module has been located (662), and if it has, the data is then corrected. Given the location of the faulty module, the memory system uses the parity relationships to reconstruct the data (664). At this time, the correct data is output from the memory system for use elsewhere in the computer.

Since a failure has occurred, a decision has to be made whether the module wherein the fault originated should be replaced (666). If the module is not to be replaced, the correct data is reloaded into the memory (680) and the system waits at READY for its next command (682). The module can be replaced only if a spare is available; the system thus interrogates itself to determine whether there is a spare module (668). Assuming an available module, the proper multiplexers are enabled, substituting a spare module for the faulty module (670), and the memory system is once again available for further input and output operations at READY (672).

If no spare module is available, then the memory no longer has the ability to repair itself but can issue correct data until a second failure occurs. With one non-repairable error, it is only capable of detecting the next error. Therefore, the memory system will continue operating using vertical block parity or exercising as a check for errors (674) and upon an additional module failure (676), the system is forced to shut down at STOP (678). Otherwise, it may operate indefinitely in this reduced capability mode (674).

Had the vertical block parity test (660) failed to indicate the faulty module (662), the memory system would then try to perform an exercising test (684) to locate the faulty module. If the exercising test is successful in locating the failed module (686), the desired data is then reconstructed using parity (664). If the exercising test is also unable to determine which module is defective, then the error cannot be corrected and the system must shut down (688).

The preceding read error detection and correction, and module replacement operations will now be examined in greater detail.

Memory Read Operation—FIG. 12

It will be assumed at start-up that all modules are operative and that no spares are connected. The 100 series multiplexers and 200 series demultiplexers are enabled to accept the outputs and inputs, respectively, of modules D1 through D6 and P. Also, the 300 series multiplexers are enabled to accept the outputs of the series 100 of multiplexers. Finally, the 700 series multiplexers are enabled to accept all inputs from the memory bus 44.

On command from the controller 54, the address generator 50 presents the address of the desired data word on the address bus 52 (902). The addressed location in the memory is read, and this information is presented on the memory bus (904). If not done previously, as noted before, the memory bus inputs of the 700 series multiplexers in the horizontal block parity checker 46 are enabled (906). As soon as the data appears on the memory bus 44, exclusive-OR gate 600 and OR gate 610 perform a parity check (908). This time, every byte including the parity byte is exclusive-ORed with one another. From equation 4, this yields:

$$D1 \oplus D2 \oplus D3 \oplus D4 \oplus D5 \oplus D6 \oplus P = \text{Parity Check} \qquad (7)$$

If there are no errors, the exclusive-OR summation of all the data bytes and the parity byte will yield the null vector, or zero, which appears at the output of exclusive-OR gate 600 as a byte of eight zeros. This result is combined in OR gate 610 to produce a single line output on bus 620. If the retrieved data is correct, the output of OR gate 610 will likewise be zero, indicating the null vector. If this be the case, the memory bus input port of multiplexer 406 is enabled (910) and the data register 410 is loaded with the information on the memory bus 44 (912). The output bus port of demultiplexer 412 is enabled to transmit the output of data register 410 (914) and the contents of data register 410 are now presented on the output bus 40 (916). This completes the read operation where the data was correct (918).

Had the output of exclusive-OR 600 been other than the null vector, this would have indicated an error in the data or the parity byte. At this point, it is known that there is an error, but it is not known which of the active modules is at fault. The fault may be located by one of two methods. A check of vertical block parity may be performed or exercising may be employed (920). The analysis will proceed first with vertical block parity.

Figure 13:
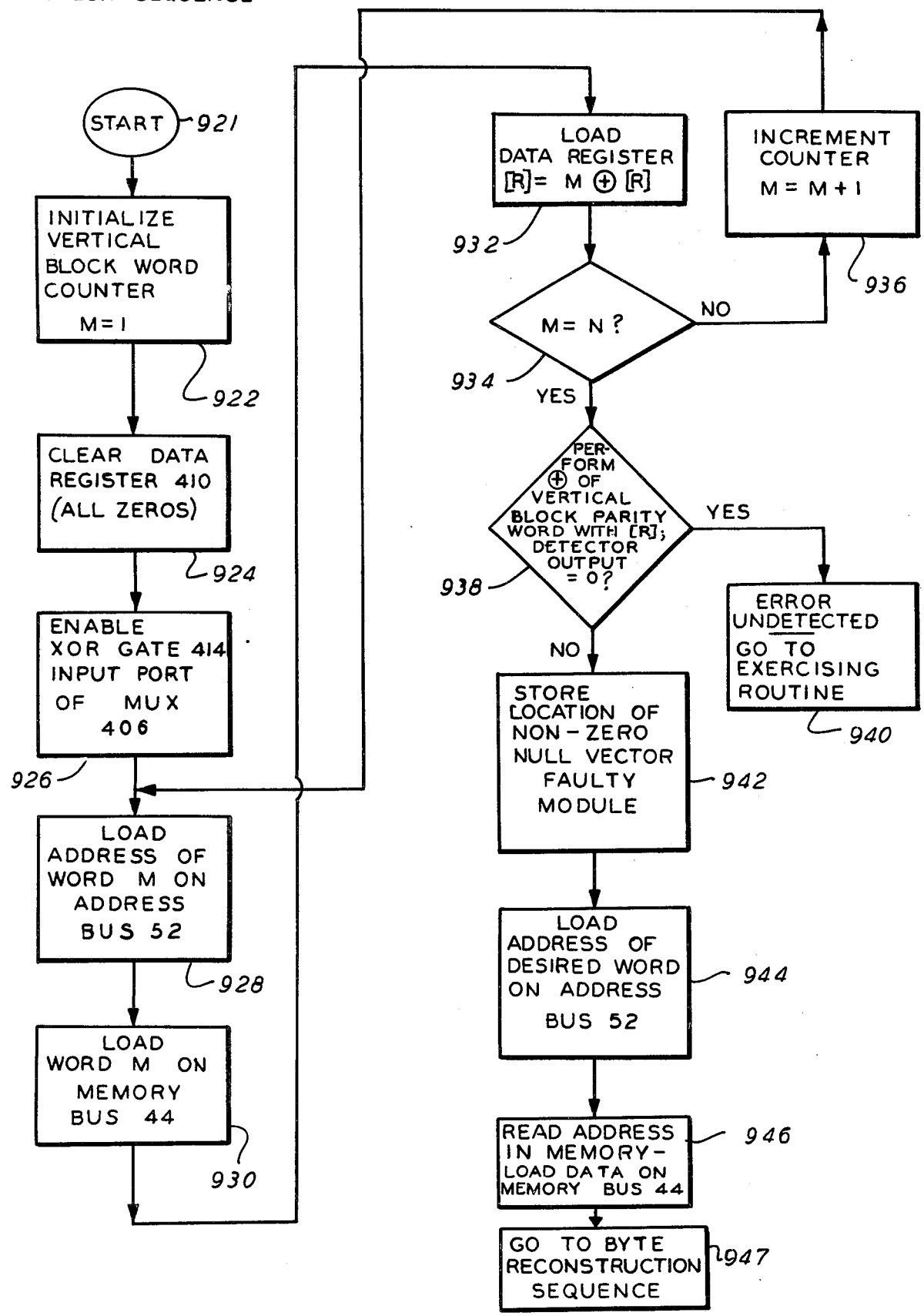
FIG. 13 is a flow chart of the vertical block parity check sequence.

Vertical Block Parity Check—FIG. 13

The counter M located in the controller 54 is initialized (922) and the data register 410 is set to zero (924). In order to channel the partial exclusive-OR summation into the data register 410, the exclusive-OR gate 414 input port of multiplexer 406 is enabled (926). Next, the address generator 50 loads the address of the word corresponding to M on the address bus 52 (928) enabling the memory to load this word on the memory bus 44 (930). As in the vertical block parity generation routine, the output of exclusive-OR gate 414 is now the exclusive-OR summation of the contents of the data register and the data appearing on the memory bus 44, which is loaded into the data register 410 (932). The status of counter M is then compared against the total number of words N in the block (934). Since this is only the first word, the counter is incremented (936) and a new address is loaded (928) on the address bus 52. Another word, corresponding to the new M, is read (930), the data register is loaded (932) with a partial summation, and the counter status is again checked (934). This process is repeated until M equals N (934). The sequence to this point is similar to the generation of vertical block parity but now differs in that the previously generated vertical block parity is fetched and exclusive-ORed with the result of exclusive-ORing the block elements.

The output of exclusive-OR gate 414 is the exclusive-OR summation of all bit strings within the block and the vertical block parity string. This output is separated into seven bundles of eight lines apiece, where each bundle represents one active module. The lines within each bundle are ORed together to produce a single line output. Should any output be equal to one, this would indicate that the associated module is in error.

When the entire block and its vertical block parity have been processed, the outputs of the 500 series OR gates are checked to determine the location of the faulty module (938). If the outputs are all zeros, this would indicate that the error has not been located by checking vertical block parity. The controller will then institute an exercising sequence, which is explained in detail below (940).

If one of the OR gates 500 has registered a one, indicating a faulty module, the controller 54 receives and stores the location of the non-zero vector (942). Since it is now known which module was at fault, the byte can be reconstructed using the remaining correct bits. The address of the desired word is presented on the address bus 52 (944), the memory is read, and the data is presented on the memory bus 44 (946).

Byte Reconstruction Sequence—FIG. 14

The data now appearing on the memory bus 44 is correct except for the one known erroneous byte. Utilizing horizontal block parity, zeros can be substituted for the erroneous byte and the correct bits can be recovered through an exclusive-OR summation in the horizontal block parity generator 46. Thus, the input port of the 700 series multiplexer corresponding to the faulty module is enabled for zeros (949). Similarly, the horizontal block parity generator input port of the 300 series multiplexer corresponding to the faulty module is enabled (950). The remaining 700 series multiplexers are enabled to accept the input from the memory bus 44 (952). The data present on the memory bus 44 at this point is the correct data, since the erroneous information has been blocked by the 300 series multiplexer and the corrected byte supplied by the horizontal block parity generator 46. This data is loaded into the data register 410 (954) and the output bus port of demultiplexer 412 is enabled to transmit the output of the data register 410 (956). The contents of the data register are finally output (958) on the output bus 40.

The correct data is still on the memory bus 44 and the address generator is set to the correct location. On command from the controller 54, the proper data is stored into memory via the 200 series demultiplexers (960).

Before proceeding with the module replacement sequence, an alternative method for locating a faulty module will be considered.

Fault Location By Exercising—FIG. 15

Another way of locating a faulty module is through self test or exercising. At step 920 in the sequence (FIG. 12), it is known that there is an error in the word, but it is not known which byte in particular contains erroneous information. The procedure of exercising requires clearing the data contained in the memory location and loading it with a test pattern. Once loaded, the memory is read and the retrieved information is compared against the original test pattern. If there are any differences, this indicates the location of the error. A sequence of different patterns is most effective.

Before entering a test pattern in the memory, it is necessary to save the existing data for reconstruction after the test. This data, which is on the memory bus 44, is loaded into temporary storage register 408 (963). The data register 410 is now cleared (964) and the memory bus output port of demultiplexer 412 is enabled (966). To introduce the test pattern into the system, the test pattern generator 42 input port of multiplexer 406 is enabled (968) and the data register 410 is loaded with a test pattern (970). The address of the suspect location is loaded on the address bus 52 (972) and the memory is loaded with the contents of the data register 410 (974).

A comparison of the original test pattern may now be made against the pattern residing in the suspect location in memory. The memory bus output port of demultiplexer 412 is disabled (976) and the memory is again read and its contents are placed on the memory bus 44 (978). Exclusive-OR gate 414 compares the original test pattern against the pattern located on the memory bus 44 and that summation is processed by the series 500 exclusive-OR gates (980). If the output is not zero, this indicates a faulty module and the module location is stored in memory (982). If, however, the output of the parity error detector is zero, then this indicates insensitivity to the pattern or an intermittent error (984) and further patterns can be tried. Should further testing fail to locate the error, then it is undetectable and the system is forced to shut down. Assuming that the faulty module is located, the data register 410 is loaded with the contents of the temporary storage register 408 through multiplexer 406 (986). The contents of the data register 410 are loaded onto the memory bus 44 through demultiplexer 412 (988). This data is the same data that was originally retrieved from memory and contains an erroneous byte, the location of which is now known and stored in the controller.

Given that the data is correct except for one byte, a fully correct memory word may be reconstructed using horizontal block parity. The procedure is exactly the same as used when vertical block parity located the fault, and is shown in blocks 948 through 960 in the flow chart in FIG. 14.

Since there has been a memory read error, a decision must be made as to whether the module which produced the erroneous byte must be replaced.

Should neither the exercising, which is especially useful for locating hard (repeating) failures, or the vertical block parity, useful for locating soft (intermittent) failures, locate the faulty module, the memory has reached a failed state.

Figure 16:
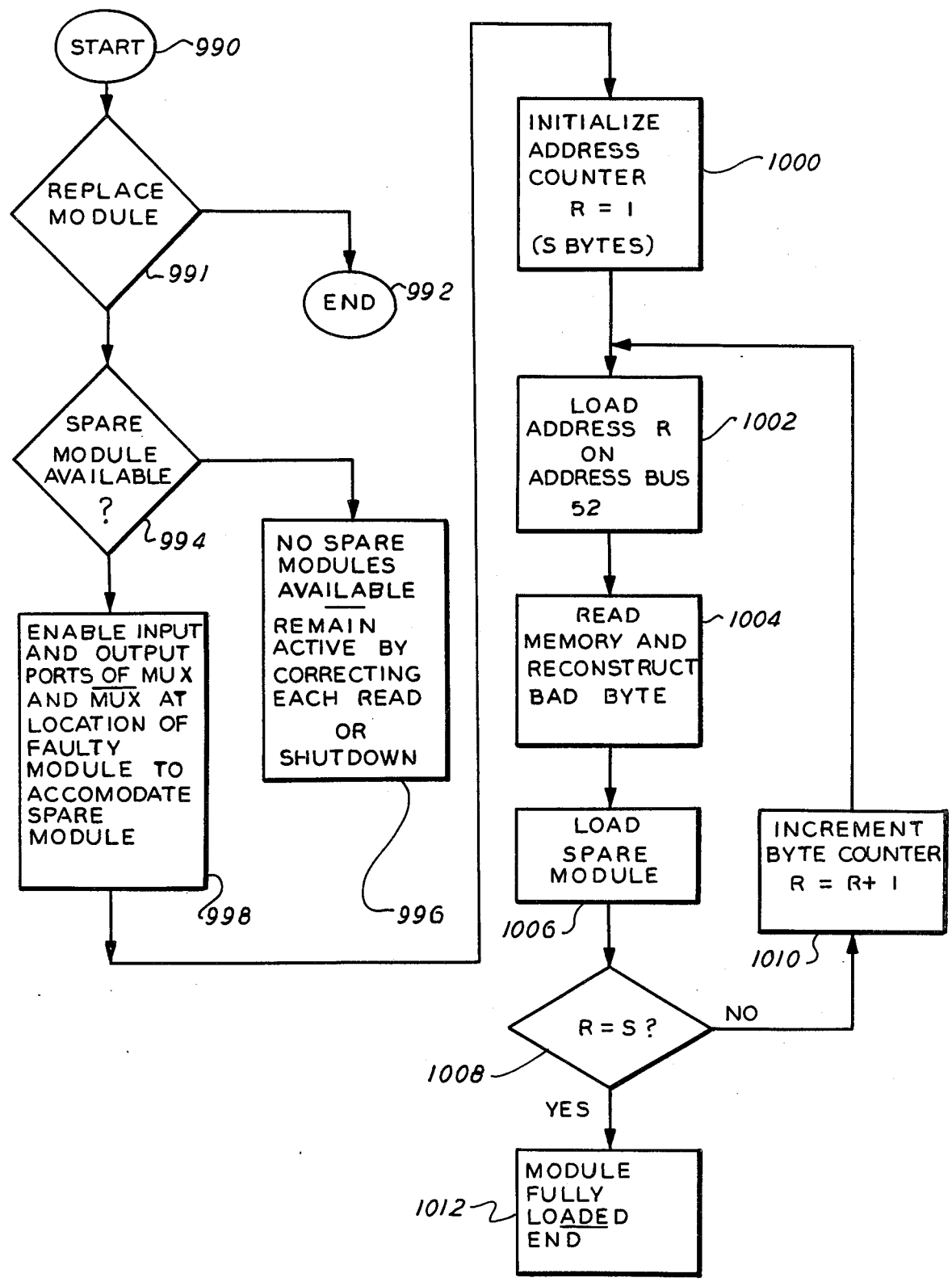
FIG. 16 is a flow chart of the module replacement sequence.

Module Replacement—FIG. 16

Erroneous data may be caused by any one of a number of conditions. During a read or write operation, electrical interference may alter the transmitted data. However, it is also possible that permanent damage can occur in one of the memory modules. If there is a permanent fault, the error will recur each time that particular address and probably other addresses are read. Should another module produce an error at this time, there would be two simultaneous errors and there would be no way of reconstructing the data and producing a correct output. If the module is not replaced or the data stored therein corrected after the first failure, the system would have to be shut down when the second module failure occurs, thus limiting the mean time between failures (MTBF). However, if a spare module could be switched in place of the faulty module, and loaded with the data contained in the original module even though the original module is now faulty, the system could then operate as before without any inconvenience to the user. Externally, the user would be unable to detect any change within the system; the reconfiguration of operative modules is "transparent" to the user.

Obviously, the parity module could conceivably fail. If this occurs, a spare module, if available, would be inserted in its place.

The decision to replace a module can be based upon many factors. Some of these factors may include a repetitive hard failure, a set number of failures, a given number of failures over a period of time, or a ratio of failures to the total number of retrievals. If the decision to replace the module (991) is negative then the retrieval operation is complete (992). If the selected criteria for replacement is met, it must first be determined that there is a spare module available (994) and that if no spare modules are available (996), then the system can continue to operate by reconstructing data for the bad module until a second failure occurs.

Assuming that a spare module can be deployed, the module switching logic 34 is enabled to accept the spare module in place of the faulty module. This requires the enabling of the input and output ports of a 100 series multiplexer and a 200 series multiplexer at the location of the faulty module (998). For example, if module D1 had failed, and it is to be replaced by module S1, then multiplexer 110 is enabled to accept the output of module S1 and the output port of demultiplexer 210 is enabled to channel the input to module S1.

Once the spare module is switched into place, it is loaded with the correct data. This is obtained from the horizontal block parity generator 46 via a 300 series multiplexer which is enabled to accept the output of the generator (see step 950).

Each module contains an arbitrary number S bytes. A counter R is initialized to keep track of the loading of the module (1000). The address of byte R is loaded on the address bus 52 (1002) and byte R is read from memory (1004). The correct data is now present on the memory bus 44 and can be placed directly in the spare module (1006). Counter R is now checked to see whether the entire module has been loaded by comparing R to S (1008). If R does not equal S, then the counter must be incremented (1010) and a new address, corresponding to the new R, is loaded (1002) onto the address bus 52. The memory is accessed again (1004) and reloaded with correct data (1006). When the byte counter indicates that the module is fully loaded (1008), the routine is complete (1012) and a spare module has now replaced the faulty module. The system is free to initiate a new read or write operation.

While there has been described what is believed to be the preferred embodiment of the invention, those skilled in the art will recognize that other and further modifications may be made thereto without departing from the spirit of the invention, and it is intended to claim all such embodiments as fall within the true scope of the invention. It should be understood, therefore, that one may implement the sequences presented in FIGS. 9 through 16 in hardware, software, or firmware, or some combination thereof.

I claim:
1. A memory system, comprising:
 a multiple bit memory subdivided into a plurality of data storage matrices having horizontal rows and vertical columns of uniform length, respectively;
 addressing means for said matrices;
 input and output means for said matrices;
 means for determining when one of the matrices becomes defective, said defect determining means including parity check means and exercising means, said partity check means including first means and second means, said exercising means being adapted for generating and checking test patterns that are stored in and retrieved from said date storage matrices;
 said first means being adapted for generating and checking vertical block parity of each said matrix;
 said first means comprising at least one vertical parity storage row for each said matrix where said row has a length equal to said length of said horizontal rows;

said second means being adapted for generating and checking horizontal block parity of said matrices, said second means comprising a horizontal parity storage matrix identical to said matrices;

at least on spare matrix identical to said storage matrices; and means for substituting said spare matrix for one of said matrices when said one of said matrices becomes defective, said substituting means having input means for receiving input data which enables the substituting means to determine when said one of said matrices becomes defective.

2. A memory system, as set forth in claim 1 above, wherein said first and second means further comprise exclusive-OR means.

3. A memory system, as set forth in claim 1 above, further comprising means for generating a signal when all of said spare matrices have been employed and a further storage matrix becomes defective.

4. A method of storing and retrieving data in a memory system, said memory system comprising a plurality of identical storage matrices, each said storage matrix containing a plurality of bit locations ordered in coordinate fashion, where each bit location contains one bit, and where at least one of said storage matrices is a horizontal block parity storage matrix and remaining said matrices are data storage matrices, said memory system further comprising addressing means, control means, and input and output means, said method comprising the steps of:

storing data in said data storage matrices;

generating horizontal block parity words by selecting, for each bit location, the bit from the same coordinate bit location in each of said data storage matrices; performing an exclusive-OR operation on said bits; and storing the result of said exclusive-OR operation in said same coordinate location in said parity storage matrix;

generating vertical block parity words for each block in each of said storage matrices;

retrieving said data from said storage matrices;

checking said data by checking horizontal block parity;

correcting said data of an error if indicated during said checking step by locating said error and performing a horizontal exclusive-OR summation, said step of locating said error being performed by first checking vertical block parity, and thereafter, if the error is not yet located by exercising said bit locations in said matrices; and substituting a spare matrix for a defective storage matrix.

* * * * *